(12) United States Patent
Olson

(10) Patent No.: US 7,855,148 B2
(45) Date of Patent: Dec. 21, 2010

(54) METHODS OF ISOLATING ARRAY FEATURES DURING PITCH DOUBLING PROCESSES AND SEMICONDUCTOR DEVICE STRUCTURES HAVING ISOLATED ARRAY FEATURES

(75) Inventor: Adam L. Olson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/759,162

(22) Filed: Apr. 13, 2010

(65) Prior Publication Data

US 2010/0193917 A1    Aug. 5, 2010

Related U.S. Application Data

(63) Continuation of application No. 11/756,218, filed on May 31, 2007, now Pat. No. 7,709,390.

(51) Int. Cl.
  *H01L 21/302* (2006.01)
(52) U.S. Cl. .............. 438/699; 438/945; 257/775; 257/E21.036; 257/E21.039
(58) Field of Classification Search ............ 438/699, 438/945, 947, 950; 257/775, E21.036, E21.038, 257/E21.039
See application file for complete search history.

(56) References Cited

U.S. PATENT DOCUMENTS

| 5,278,105 | A | 1/1994 | Eden et al. |
| 5,597,763 | A | 1/1997 | Sim |
| 5,736,300 | A | 4/1998 | Mizuno et al. |
| 6,022,815 | A | 2/2000 | Doyle et al. |
| 6,333,213 | B2 | 12/2001 | Hasebe et al. |
| 6,713,396 | B2 | 3/2004 | Anthony |
| 6,982,221 | B1 | 1/2006 | Hsu |
| 7,154,132 | B2 | 12/2006 | Shimizu |
| 7,474,000 | B2 | 1/2009 | Scheuerlein et al. |
| 2006/0216922 | A1 | 9/2006 | Tran et al. |
| 2006/0228854 | A1 | 10/2006 | Tran et al. |
| 2006/0240362 | A1 | 10/2006 | Sandhu et al. |
| 2009/0075485 | A1* | 3/2009 | Ban et al. .................. 438/751 |

OTHER PUBLICATIONS

International Search Report for PCT/US2008/064521 dated Aug. 18, 2008, 3 pages.
International Written Opinion for PCT/US2008/064521 dated Aug. 18, 2008, 5 pages.

* cited by examiner

*Primary Examiner*—Caridad M Everhart
(74) *Attorney, Agent, or Firm*—TraskBritt

(57) ABSTRACT

Methods of isolating spaces formed between features in an array during a pitch reduction process and semiconductor device structures having the same. In one embodiment, ends of the features are wider than middle regions of the features. During the pitch reduction process, spacer sidewalls formed between adjacent ends of the features come into substantial contact with one another, isolating the spaces between the features. In another embodiment, the features have a single width and an additional feature is located near ends of the features. Spacer sidewalls formed between adjacent features and the additional feature come into substantial contact with one another, isolating the spaces between the features.

18 Claims, 10 Drawing Sheets

US 7,855,148 B2

METHODS OF ISOLATING ARRAY FEATURES DURING PITCH DOUBLING PROCESSES AND SEMICONDUCTOR DEVICE STRUCTURES HAVING ISOLATED ARRAY FEATURES

CROSS-REFERENCE TO RELATED APPLICATION

This application is a continuation of U.S. patent application Ser. No. 11/756,218, filed May 31, 2007, now U.S. Pat. No. 7,709,390, issued May 4, 2010, the entire disclosure of which is hereby incorporated herein by this reference.

FIELD OF THE INVENTION

Embodiments of the invention relate generally to the fabrication of semiconductor device structures and, more specifically, to methods of isolating array features and to semiconductor device structures having such features.

BACKGROUND

Integrated circuit ("IC") designers desire to increase the level of integration, or density, of features within an IC by reducing the size of the features and by reducing the separation distance between neighboring features on a substrate. The distance between identical points in neighboring features is referred to in the industry as "pitch" and is conventionally measured as the center-to-center distance between the features. The pitch is about equal to the sum of a width of the feature and a width of a space separating the feature from the neighboring feature. With the pressure to reduce feature sizes and pitch, pitch reduction processes have been developed.

A conventional pitch reduction process, which is also sometimes implemented as a "pitch multiplication" process is illustrated in FIGS. 1A-1G. Pitch multiplication is used to form at least two features in a target material, such as a substrate, for each feature formed in a mask, such as a resist material, overlying the target material. As illustrated in FIG. 1A, an array of first features 10 is formed in the resist material overlying the target material 20. The first features 10 are typically formed having a minimum feature size ("F"). First features 10 are separated from each other by first spaces 12. First features 10 and first spaces 12 have a first pitch, which is labeled in FIG. 1A as "X." A spacer material 30 is formed over first features 10 and target material 20, as illustrated in FIG. 1B. The spacer material 30 reduces the width of first spaces 12, forming first spaces 12'. Spacer material 30 is anisotropically removed to form spacer sidewalls 36, as illustrated in FIGS. 1C and 1D, where FIG. 1D is a cross-sectional view along line a-a in FIG. 1C. As illustrated in FIG. 1C, which is a top view of the illustration in FIG. 1D, spacer sidewalls 36 surround each of first features 10. First features 10 are removed from target material 20, forming freestanding spacer sidewalls 36, as illustrated in FIG. 1E. The removal of first features 10 produces second spaces 18 surrounded by spacer sidewalls 36. The spacer sidewalls 36, second spaces 18, and first spaces 12' are used as a mask to pattern the target material 20. The pattern in the target material 20 includes second features 32 (see FIG. 1G), such as lines or trenches, that correspond to second spaces 18 and first spaces 12' and third spaces 34 (see FIG. 1G) that correspond to the spacer sidewalls 36. The second features 32 and third spaces 34 in the target material 20 have a pitch about one-half of the first pitch, which is labeled in FIG. 1E as "X/2." Where the width X included one first feature 10 and first space 12 before the pitch doubling process, width X now includes two second features 32 and two third spaces 34. While the pitch is actually halved in the example above, this reduction in pitch is conventionally referred to as pitch "doubling." This conventional terminology is retained herein.

In this pitch doubling process, ends of second spaces 18 are isolated by spacer sidewalls 36. However, ends of first spaces 12' are not isolated. As illustrated in FIG. 1F, one approach to isolating first spaces 12' has been to form a mask 40 over the ends of first spaces 12', second spaces 18, and spacer sidewalls 36. Mask 40 isolates first spaces 12', while spacer sidewalls 36 serve as a mask to pattern target material 20, as illustrated in FIG. 1G. Since a second lithography process using mask 40 is used to block an etch when forming the patterned target material 20, two masking levels are used in the pitch doubling process illustrated in FIGS. 1A-1G.

A need exists in the art for methods of isolating the second spaces formed between features without using a second masking level.

DETAILED DESCRIPTION OF THE INVENTION

Embodiments of methods of the present invention for isolating arrays of features created by a pitch reduction process and semiconductor device structures produced by the same are disclosed. During the pitch reduction process, a spacer material is deposited on the features and etched to form spacer sidewalls. The features may be formed from a resist material or other sacrificial material suitable for forming a mask. The spacer sidewalls may be of a sufficient thickness to substantially fill a distance between ends of adjacent features. As such, spaces between adjacent features are isolated by the spacer sidewalls. In one embodiment, the pitch reduction process is a pitch doubling process.

The methods and semiconductor device structures described herein do not form a complete process flow for processing semiconductor device structures. The remainder of the process flow is known to those of ordinary skill in the art. Accordingly, only the methods and semiconductor device structures necessary to understand embodiments of the present invention are described herein. The material layers described herein may be formed by a suitable deposition technique including, but not limited to, spin coating, blanket coating, chemical vapor deposition ("CVD"), atomic layer deposition ("ALD"), plasma enhanced ALD, or physical vapor deposition ("PVD"). Depending on the material to be used, the deposition technique may be selected by a person of ordinary skill in the art.

Reference will now be made to the drawings, where like numerals refer to like parts throughout. The drawings are not necessarily drawn to scale.

Figure 2A:
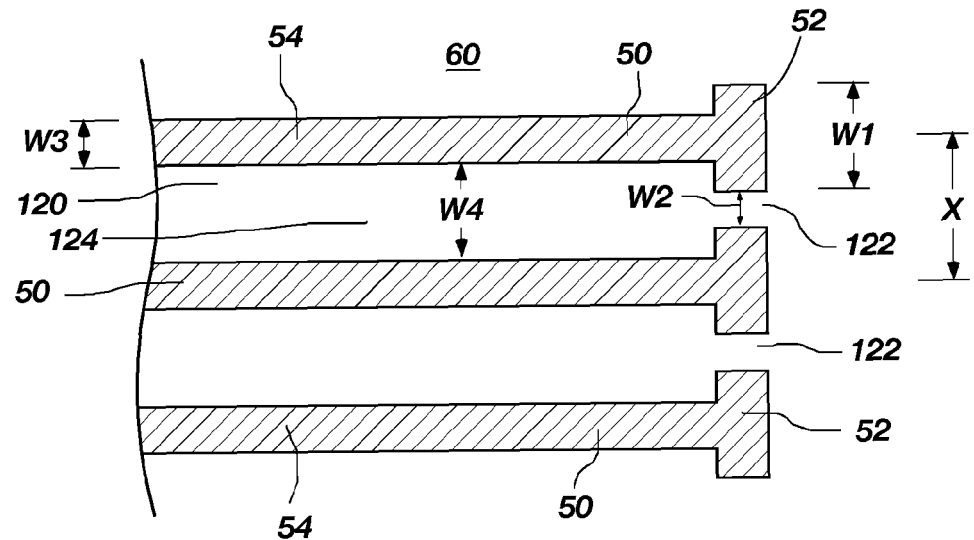
FIGS. 2A, 2B, and 2D are top-down views of a semiconductor device structure during various stages of processing according to an embodiment of the present invention

Methods of isolating array features according to embodiments of the present invention are illustrated in FIGS. 2A-4C. In one embodiment, the features have a minimum feature size ("F"). However, depending on the technique used to form the features, the features may have a feature size larger than F. As shown in FIG. 2A, an array of third features 50 is present on substrate 60. The third features 50 may be separated from each other by fourth spaces 120. The distance between third features 50 and fourth spaces 120 may be configured such that upon pitch doubling, fourth spaces 120 become isolated by the spacer material deposited on the third features 50. Ends 52 of third features 50 may be wider than middle regions 54 of third features 50 and ends 122 of fourth spaces 120 may be narrower than middle regions 124 of fourth spaces 120. In one embodiment, ends 52 of the third features 50 are substantially adjacent to one another such that the spacer material, when deposited over the third features 50, comes into substantial contact with itself at least one point in ends 122 of fourth spaces 120. The width W1 of ends 52 of third features 50 and the width W2 of ends 122 of fourth spaces 120 may be configured so as to enable fourth spaces 120 to self-isolate by the deposition of the spacer material therebetween during the pitch doubling process. As explained in detail below, the spacer material may be deposited at a thickness sufficient to substantially fill ends 122 of the fourth spaces 120.

The width of middle regions 54 of third features 50 is labeled W3 and the width of middle regions 124 of fourth spaces 120 is labeled W4. The width W3 of the middle regions 54 corresponds to the desired size of at least one feature ultimately to be formed on the substrate 60. The width W3 of the middle regions 54 of third features 50 and the width W4 of the middle regions 124 of fourth spaces 120 may be the same as, or different from, each other, depending on the desired size of the features and lines to be formed in substrate 60. The widths W3 and W4 may also be the same as, or different from, the width W2 of the ends 122 of fourth spaces 120. In one embodiment, the width W2 of ends 122 of fourth spaces 120 is less than or about equal to one-half the first pitch X of third features 50. In another embodiment, the width W2 of ends 122 of fourth spaces 120 about equals the minimum feature size F possible with the lithography technique used to form the third features 50.

Although ends 52 are wider than middle regions 54, the first pitch X between adjacent ends 52 of third features 50 and between adjacent middle regions 54 of third features 50 remains the same. For example, if the first pitch X between adjacent middle regions 54 of third features 50 is about 200 nm (W3 is about 100 nm and W4 is about 100 nm) and the width W2 of ends 122 of fourth spaces 120 is about 75 nm, the width W1 of ends 52 of third features 50 is about 125 nm to equal the original pitch of about 200 nm.

FIG. 2A (and subsequent drawings) illustrates a portion of the array of third features 50. However, numerous individual third features 50 may be present in the array. Additionally, for convenience, only one end 52 of each third feature 50 is illustrated in FIG. 2A (and subsequent drawings). However, the non-illustrated end of each third feature 50 may be the mirror-image of the illustrated end 52.

The third features 50 may be formed from a material compatible with the pitch doubling process. For example, the third features 50 may be formed from a resist material that is deposited on substrate 60 and patterned using a conventional lithography technique. Exemplary lithography techniques include, but are not limited to, 248 nm and 193 nm photolithography, electron-beam lithography, and X-ray lithography. The lithography technique may be selected depending on the desired size of the third features 50 and the desired size of the features to be formed in the substrate 60. Resist materials, such as positive and negative resists, are known in the art and, therefore, are not described in detail herein. The third features 50 may also be formed from other sacrificial materials, such as a carbon-containing material. As such, the pattern of the third features 50 may be etched into substrate 60 prior to depositing the spacer material of spacer sidewalls 70. The third features 50 may be printed on the substrate 60 at F or at a feature size greater than F. By way of non-limiting example, the third features 50 may have a feature size of 100 nm or a feature size of 75 nm. However, the feature size may be any size achievable by conventional lithographic techniques.

Figure 2B:
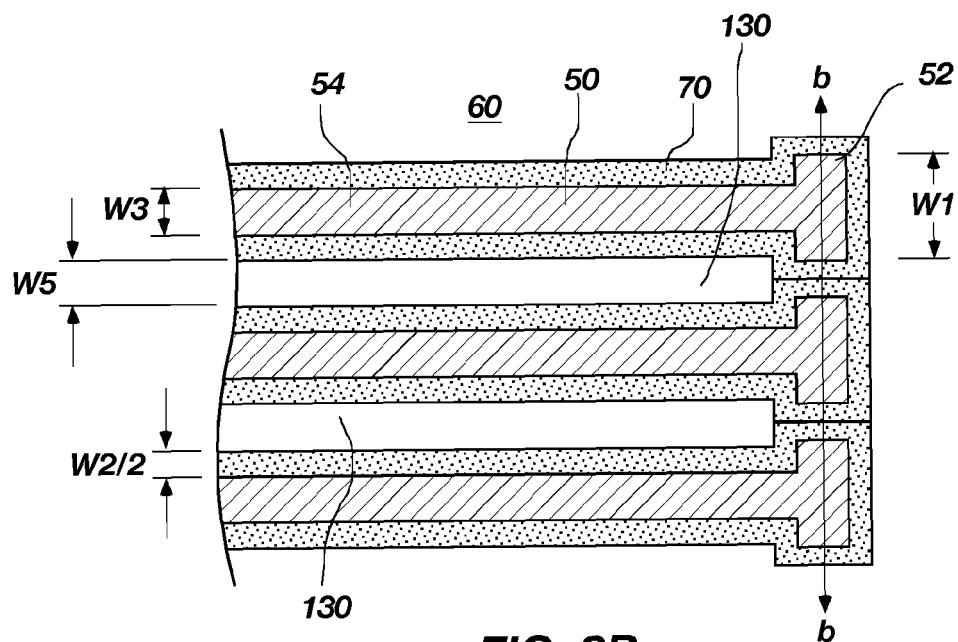

The third features 50 with ends 52 and middle regions 54 of different widths and the fourth spaces 120 with ends 122 and middle regions 124 of different widths may be formed using a mask having corresponding regions of different widths. As known in the art, a mask may be used to pattern the resist material, forming the third features 50 and fourth spaces 120. Depending whether the resist material is a positive resist or a negative resist, the mask may include a pattern substantially similar to the desired pattern of third features 50 or a pattern substantially similar to the negative image of the desired pattern of third features 50. Mask fabrication and patterning and development of resist materials are known in the art and, therefore, are not described in detail herein. While FIGS. 2A and 2B illustrate ends 52 of the third features 50 having a so-called "T" shape, ends 52 may have any shape that enables spacer sidewalls 70 (see FIG. 2B), deposited thereon, to substantially fill ends 122 of the fourth spaces 120. By way of non-limiting example, ends 52 of third features 50 may have a circular, triangular, "L," or other shape.

Substrate 60 may be formed from a material that is compatible with semiconductor device structure processing and that is selectively etchable relative to the material used to form the spacer sidewalls 70. As used herein, a material is "selectively etchable" when the material exhibits an etch rate of at least about two times greater than that of another material exposed to the same etch chemistry. Ideally, such a material has an etch rate of at least about 10 times greater than that of another material exposed to the same etch chemistry. The material of the substrate 60 may also be etchable at substantially the same rate, or a slower rate, than the material of the spacer sidewalls 70 if an anisotropic etch technique is used to etch the material of the substrate 60. For instance, the substrate 60 may be a semiconductor substrate, such as a conventional silicon substrate, or other bulk substrate that includes semiconductive material. As used herein, the term "bulk substrate" means and includes silicon wafers, silicon-on-insulator ("SOI") substrates, silicon-on-sapphire ("SOS") substrates, epitaxial materials of silicon on a base semiconductor foundation, and other semiconductor, optoelectronics, or biotechnology materials, such as silicon-germanium, germanium, gallium arsenide, gallium nitride, or indium phosphide.

Substrate 60 may also include at least one intermediate material formed over the semiconductor substrate or bulk substrate. The intermediate material may include at least one of an antireflective coating ("ARC"), a carbon-containing material, such as a transparent carbon ("TC") material, an amorphous carbon ("AC") material, or other material selectively etchable relative to the spacer material, such as tungsten, aluminum, copper, or combinations thereof. ARC materials are known in the art and include, but are not limited to, inorganic materials, such as silicon dioxide, silicon oxynitride, polysilicon, or combinations thereof, which are dielectric antireflective coatings ("DARC"), or organic materials, such as a silicon-containing, spin-on hard mask. By way of non-limiting example, if the substrate 60 includes the intermediate material, the substrate 60 may include the bulk substrate, a TC material or AC material formed over the bulk substrate, and an ARC material formed over the TC material or AC material. The intermediate material may be formed by conventional techniques, such as by CVD, PVD, or by spin-coating.

Figure 2C:
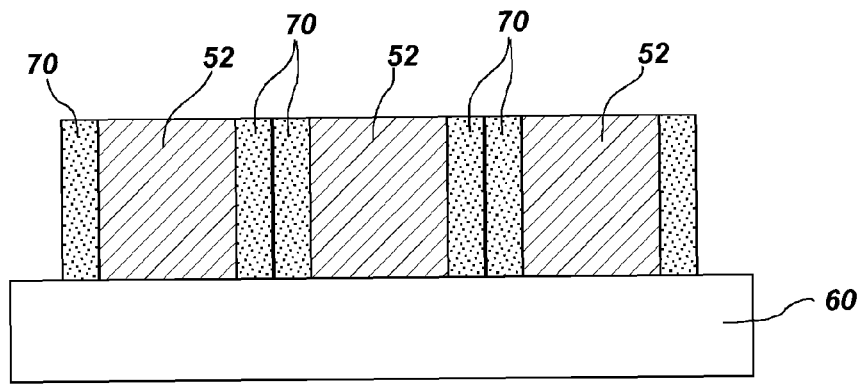
FIGS. 2C and 2E are cross-sectional views of a semiconductor device structure during various stages of processing according to an embodiment of the present invention.

FIG. 2B and FIG. 2C illustrate spacer sidewalls 70 surrounding each of third features 50 in the array. FIG. 2C is a cross-section of FIG. 2B along line b-b. Spacer sidewalls 70 reduce the width W4 of fourth spaces 120 to width W5 of seventh spaces 130. The width of middle regions 124 of fourth spaces 120 is reduced by twice the thickness of the spacer sidewalls 70. The thickness of the spacer sidewalls 70 may substantially correspond to the width of lines ultimately formed in substrate 60. However, the thickness of spacer sidewalls 70 may not correspond exactly to the width of these lines. For example, spacer sidewalls 70 may be about 42 nm thick, producing lines in the substrate 60 having a width of about 50 nm. Spacer sidewalls 70 may be deposited at a thickness greater than or equal to about one-half the width W2 of ends 122 of fourth spaces 120, which is labeled on FIG. 2B as W2/2. Therefore, spacer sidewalls 70 come into substantial contact with one another in the ends 122 of fourth spaces 120 and substantially fill ends 122, isolating seventh spaces 130. Thus, the spacer sidewalls 70 may be used to self-isolate the fourth spaces 120 between third features 50.

Figure 1A:
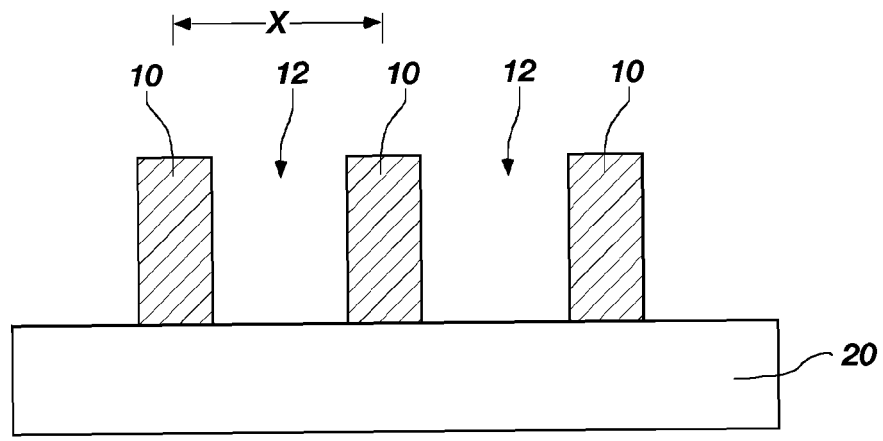
FIGS. 1A, 1B, 1D, and 1G are cross-sectional views of a semiconductor device structure during various stages of processing according to a conventional pitch reduction process.
Figure 1B:
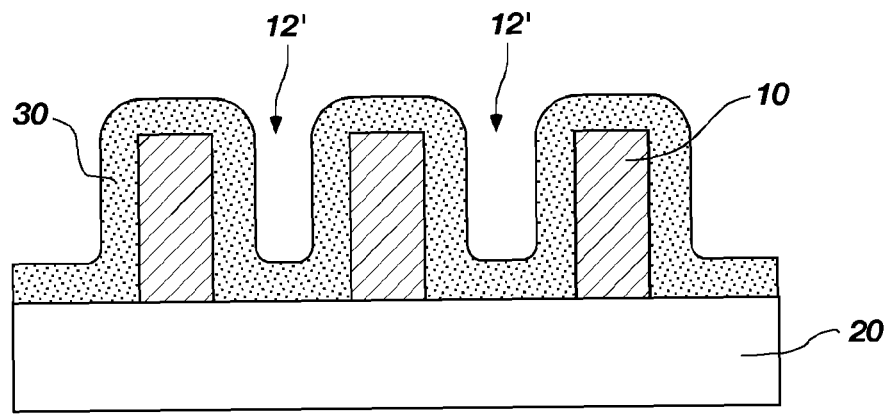
Figure 1C:
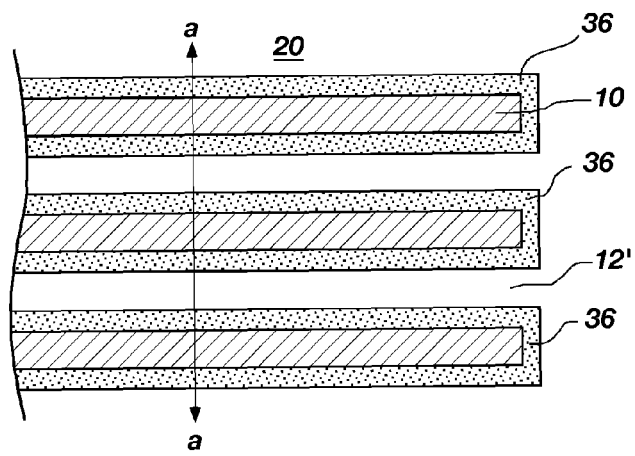
FIG. 1C is a top-down view of the semiconductor device structure illustrated in FIG. 1D, and FIGS. 1E and 1F are top-down views of the semiconductor device structure during various stages of processing according to a conventional pitch reduction process.
Figure 1D:
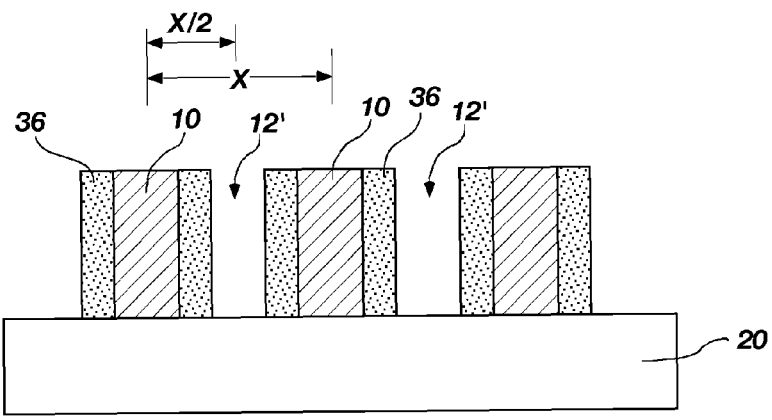
Figure 1E:
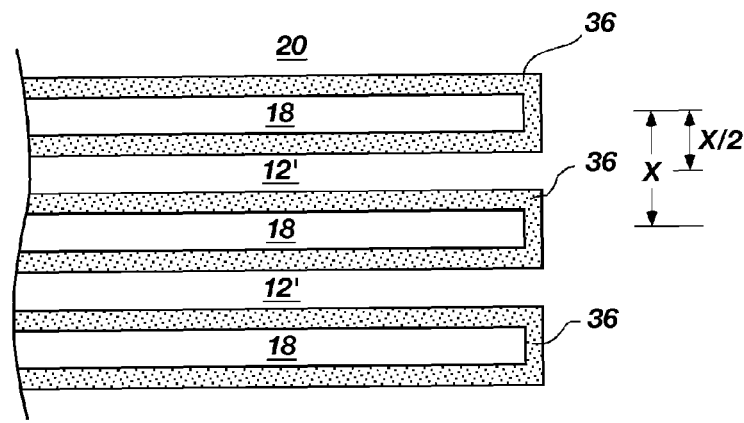
Figure 1F:
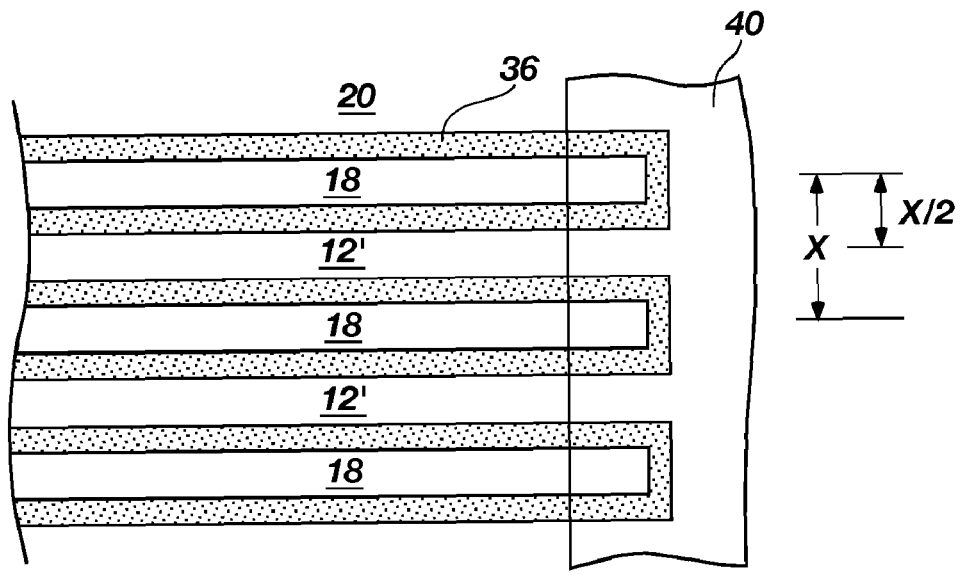
Figure 1G:
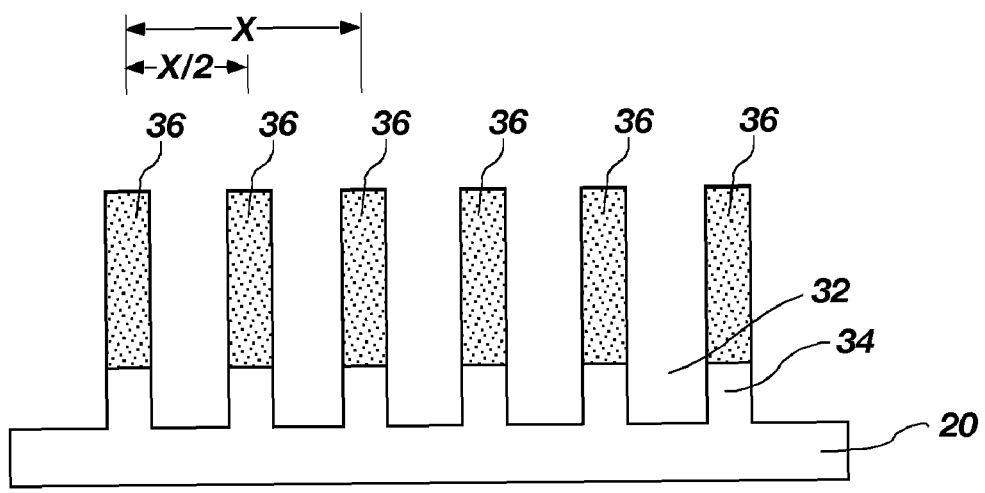

Spacer sidewalls 70 may be formed from a material that is compatible with the pitch doubling process and with subsequent processing acts. The spacer material may be formed from any material that may be conformally deposited on the third features 50, such as an organic or an inorganic material. By way of non-limiting example, the spacer material may be silicon nitride ("$Si_3N_4$"), a silicon oxide ("$SiO_x$"), or polysilicon. The spacer material may be substantially conformally deposited on the third features 50, such as by ALD. However, other deposition techniques may be used as long as the spacer material is substantially conformally deposited at the desired thickness. Spacer sidewalls 70 may be formed by anisotropically removing material from the spacer material. Depositing and anisotropically etching the spacer material is not illustrated. However, the process of forming the spacer sidewalls 70 from the spacer material is substantially the same as the process of forming the sidewalls 36 from spacer material 30, which is illustrated in FIG. 1B-1D, except that spacer sidewalls 70 substantially fill ends 122 of fourth spaces 120, as illustrated in FIG. 2B.

Etchants used to anisotropically etch the spacer material may be selected depending upon the spacer material used. The spacer material may be anisotropically etched using a hydrogen-containing or oxygen-containing gas in a diluent. By way of non-limiting example, if the spacer material is $SiO_x$, the anisotropic etch may be a plasma etch, such as a tetrafluoromethane ("$CF_4$")-containing plasma, a trifluoromethane ("$CHF_3$")-containing plasma, a $C_4F_8$-containing plasma, or combinations thereof. If the spacer material is $Si_3N_4$, the anisotropic etch may be a $CHF_3/O_2$/He plasma or a $C_4F_8$/CO/Ar plasma.

Figure 2D:
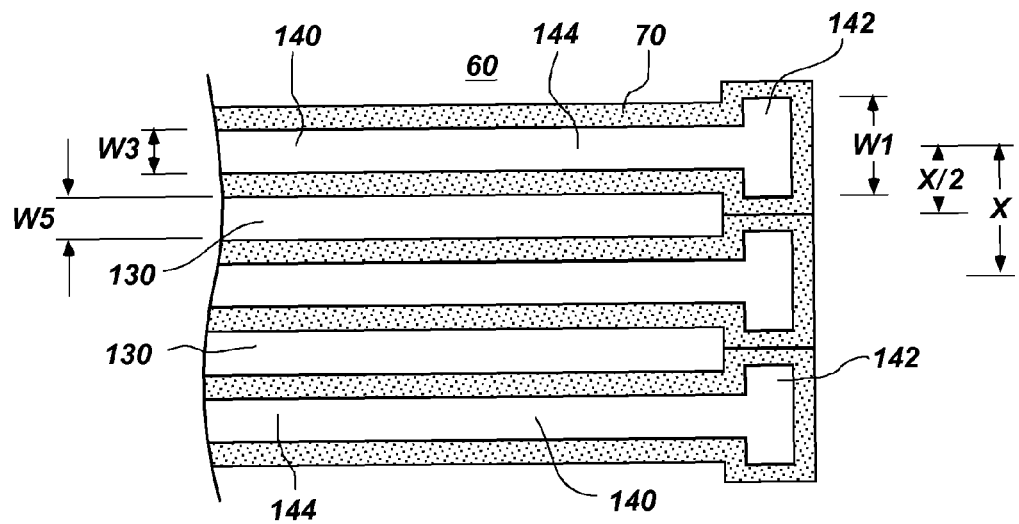

After seventh spaces 130 are isolated by spacer sidewalls 70, third features 50 may be removed, as illustrated in FIG. 2D. The third features 50 may be removed using an etchant suitable for etching a developed resist material or for removing other materials from which the third features 50 are formed. Such etchants are known in the art and, therefore, are not discussed in detail herein. Removing third features 50 produces an array of spacer sidewalls 70 and fifth spaces 140 where third features 50 were previously located. Fifth spaces 140 include ends 142 and middle regions 144. The ends 142 have a width of W1 and the middle regions 144 have a width of W3. Both fifth spaces 140 and fourth spaces 120 are isolated by spacer sidewalls 70 since adjacent spacer sidewalls 70 come into substantial contact with one another in ends 122 of fourth spaces 120 during the pitch doubling process.

The width W3 of the middle regions 144 of fifth spaces 140 may correspond to the width of fourth features 62 (see FIG. 2E) ultimately formed in the substrate 60. In one embodiment, the width W3 of the middle regions 144 of fifth spaces 140 is about equal to F, enabling fourth features 62 having a width less than F to be formed in the substrate 60. As previously described, F is the minimum feature size of third features 50 before the pitch reduction process is conducted. Middle regions 144 of fifth spaces 140 and seventh spaces 130 may be of about equal width (i.e., W3 and W5 may be substantially the same), forming fourth features 62 and first lines 150 in substrate 60 having about the same width. For fourth features 62 to have a width less than about F, the third features 50 may be formed by a lithography technique capable of printing the desired F. However, if the fourth features 62 and first lines 150 in substrate 60 are to have different widths, the widths W3 of middle regions 144 of fifth spaces 140 and W5 of seventh spaces 130 (and, thus, the widths of middle regions 54 of third features 50 and seventh spaces 130) may be different from one another.

Figure 2E:
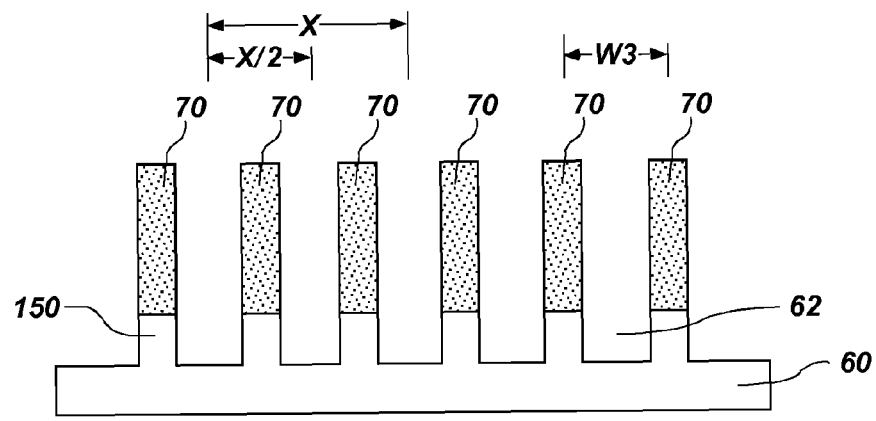

The spacer sidewalls 70, fifth spaces 140, and seventh spaces 130 may be used as a mask to pattern substrate 60, as illustrated in FIG. 2E. The mask may be used to form the fourth features 62 and the first lines 150 in the substrate 60. By way of non-limiting example, fourth features 62 may be wordlines or trenches. By isolating fifth spaces 140 and seventh spaces 130 in the manner described above, a second lithography process is not used to block etch when transferring the pattern of spacer sidewalls 70, fifth spaces 140, and seventh spaces 130 to substrate 60. As such, a lithography level is eliminated from the pitch doubling process. The fourth features 62 in substrate 60 may have a pitch equal to about one-half the first pitch X. As such, after the pitch doubling process, the width of X includes two fourth features 62 and two first lines 150. The width of fourth features 62 may be about equal to one another even though the width of seventh spaces 130 and the width of middle regions 144 of fifth spaces 140 may not be equal to one another. The pattern created by the seventh spaces 130 may transfer differently to the substrate 60 during a dry etch process than the pattern created by the middle regions 144 of fifth spaces 140 due to the resist material previously located in the middle regions 144 of fifth spaces 140. The discrepancy may also be caused by deviations from substantial verticality of the spacer sidewalls 70.

To form the fourth features 62 in substrate 60, at least one dry etch may be used. If the substrate 60 includes the semiconductor substrate or the bulk substrate, the substrate 60 may be etched using hydrogen bromide gas ("HBr")/$Cl_2$ or a fluorocarbon plasma etch, such as a $CF_4$-containing plasma, a $C_2F_6$-containing plasma, a $C_4F_8$-containing plasma, a $CHF_3$-containing plasma, a $CH_2F_2$-containing plasma, or mixtures thereof. If the substrate 60 includes at least one intermediate material over the bulk substrate, the pattern may be transferred to the intermediate material using a first dry etch process, followed by a second dry etch process to transfer the pattern to the semiconductor substrate or the bulk substrate. By way of non-limiting example, if substrate 60 includes the ARC over the semiconductor substrate or bulk substrate, a fluorocarbon plasma may be used to etch the ARC. HBr/$Cl_2$ or a fluorocarbon plasma etch may be used to etch the semiconductor substrate or bulk substrate. By way of non-limiting example, if substrate 60 includes a carbon-containing material over the bulk substrate, an oxygen-based plasma, such as an $O_2$/$Cl_2$ plasma, an $O_2$/HBr plasma, an $O_2$/$SO_2$/$N_2$ plasma, or a $N_2$/$O_2$/HBr plasma may be used to etch the carbon-containing material. HBr/$Cl_2$ or a fluorocarbon plasma etch may be used to etch the semiconductor substrate or bulk substrate. Other contemplated plasma chemistries include $O_2$ and sulfur dioxide ("$SO_2$").

Figure 3A:
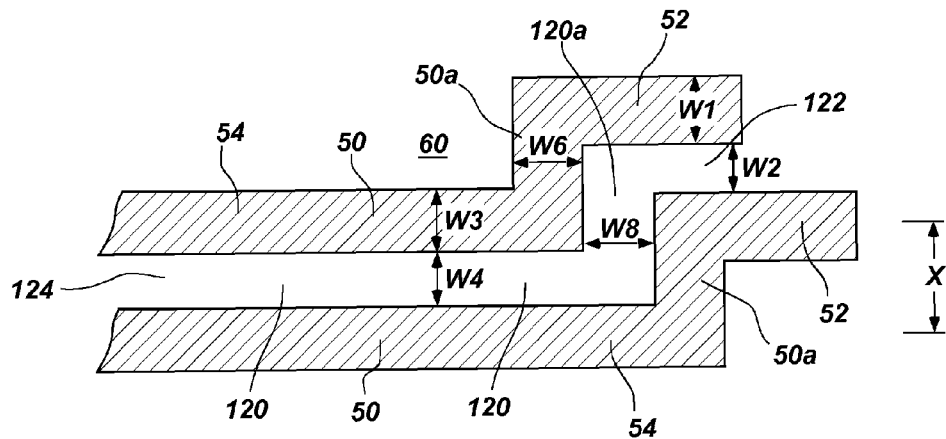
FIGS. 3A-3D are top-down views of a semiconductor device structure during various stages of processing according to an embodiment of the present invention.

In another embodiment, the width W3 of the middle regions 54 of third features 50 is greater than F. As illustrated in FIGS. 3A-3D, the third features 50 are subsequently trimmed or etched, reducing the width to about equal to F. In the embodiment illustrated in FIGS. 3A-3D, a portion of third features 50 forms a so-called "L" shape, rather than the so-called "T" shape described in FIGS. 2A-2D. However, this embodiment may be used with third features 50 having ends 52 of any shape, such as ends 52 having the so-called "T" shape. As illustrated in FIG. 3A, intermediate regions 50a join ends 52 and middle regions 54 of third features 50, providing the so-called "L" shape to the portion of the third features 50. Intermediate regions 120a join ends 122 and middle regions 124 of fourth spaces 120, providing the so-called "L" shape to the portion of the fourth spaces 120. In this embodiment, ends 52 of third features 50 may be staggered relative to each other, rather than ends 52 being substantially adjacent, as in the embodiment illustrated in FIGS. 2A-2E. As shown in FIG. 3A, a portion of neighboring ends 52 are adjacent to one another, rather than substantially all of the ends 52 of third features 50 being adjacent to each other, as illustrated in FIGS. 2A-2E. The portions of neighboring ends 52 are adjacent to one another to a degree sufficient that when the spacer sidewalls 70 are formed on the third features 50, the spacer sidewalls 70 come into substantial contact in ends 122 of fourth spaces 120.

The third features 50 formed in the resist or sacrificial material have a feature size greater than about F (width W3 is greater than about F) and the width W2 of ends 122 of fourth spaces 120 about equals F. The width W4 of middle regions 124 of fourth spaces 120 may be greater than F and may also be about equal to the width W3 of middle regions 54 of third features 50. Intermediate regions 50a of third features 50 may have the same width as ends 52, or may have a larger width or a smaller width than ends 52. The width of intermediate regions 50a of third features 50 is labeled in FIG. 3A as W6 and the width of ends 52 is labeled as W1. The width W6 of intermediate regions 50a of third features 50 may be the same as or different than the width W3 of middle regions 54. By way of non-limiting example, the width W6 may be larger than the width W3. Intermediate regions 120a of fourth spaces 120 may have the same width as intermediate regions 50a of third features 50. The width of intermediate regions 120a is labeled in FIG. 3A as W8.

Figure 3B:
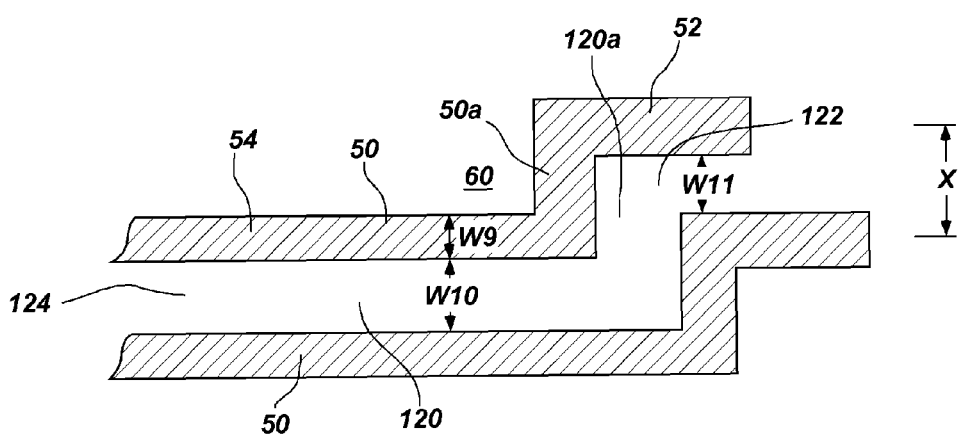

When the width W3 of middle regions 54 of third features 50 is greater than F, third features 50 may be trimmed or etched to reduce their width. The third features 50 may be etched, such as by a dry etch, before depositing the spacer material, as illustrated in FIG. 3B. The trim process reduces the width of middle regions 54 of third features 50 from greater than F to about F and increases the width of middle regions 124 of fourth spaces 120 by a corresponding amount. The width of middle regions 54 is labeled in FIG. 3B as W9 and the width of middle regions 124 is labeled as W10. The trim process may also be used to reduce the width of middle regions 54 to a width other than F, depending upon the pitch doubling process to be used and the size of fourth features 62 to be formed in the substrate 60. The trim process also increases the width of ends 122 of fourth spaces 120 by a similar amount as middle regions 124 are increased. The width of ends 122 is labeled in FIG. 3B as W11. Trim processes are known in the art and, therefore, are not discussed in detail herein. The width W11 of ends 122 of fourth spaces 120 may be equal to about one-half the first pitch X of third features 50. It should be appreciated that the trim process does not change the first pitch X but, rather, changes the relative widths of third features 50 and fourth spaces 120 that constitute the first pitch X. The pattern of the third features 50 may be transferred into the intermediate material overlying the semiconductor substrate or bulk substrate before depositing the spacer material. Alternatively, and as described herein, the spacer material may be deposited on the third features 50.

Figure 3C:
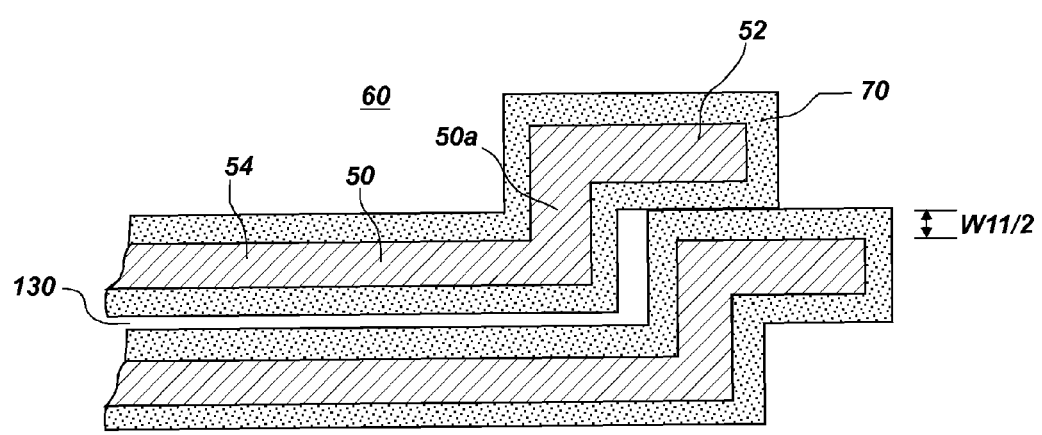
Figure 3D:
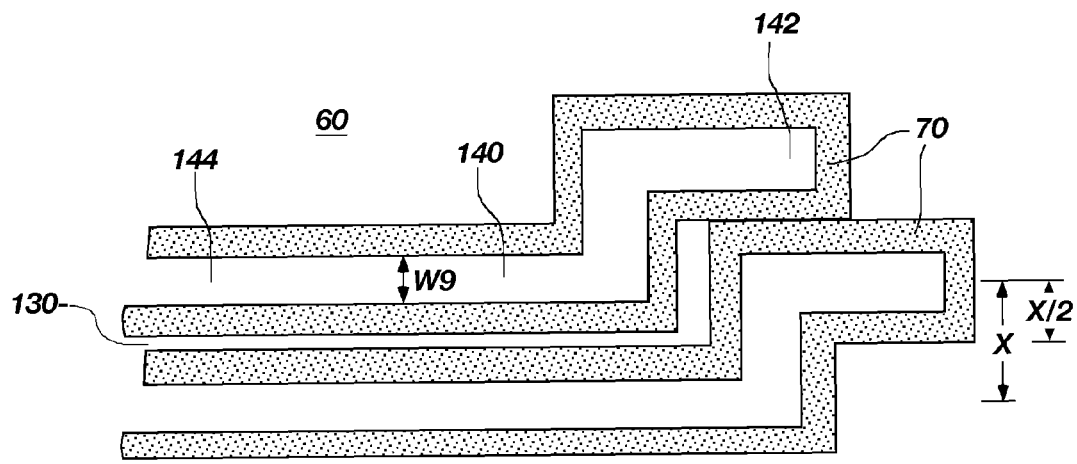

FIG. 3C illustrates spacer sidewalls 70 surrounding each of third features 50. The spacer sidewalls 70 are formed by depositing the spacer material on the third features 50 and selectively etching the spacer material, as previously discussed. The thickness of spacer sidewalls 70 is greater than or equal to about one-half the distance between adjacent ends 52 of third features 50. In other words, the thickness of spacer sidewalls 70 is greater than or equal to about W11/2. The spacer sidewalls 70 come into substantial contact in ends 122 of fourth spaces 120, forming and isolating seventh spaces 130. The third features 50 are removed, as illustrated in FIG. 3D, forming fifth spaces 140. Both fifth spaces 140 and seventh spaces 130 are isolated by spacer sidewalls 70. The spacer sidewalls 70, fifth spaces 140, and seventh spaces 130 may be used as a mask to pattern substrate 60, such as to form fourth features 62 and first lines 150 in the substrate 60.

By way of non-limiting example, if the pitch to be achieved by pitch doubling is about 100 nm and F is about 72 nm (from about 69 nm to about 75 nm), the third features 50 having a feature size of about 92 nm may be formed by an appropriate lithography technique. The width W3 of middle regions 54 of third features 50 is about 92 nm and the width W1 of ends 52 of third features 50 is about 112 nm. The width W2 of ends 122 of fourth spaces 120 equals about 72 nm and the width W4 of middle regions 124 of fourth spaces 120 is about 108 nm. As such, the first pitch X between third features 50 is about 200 nm. Third features 50 are trimmed by about 20 nm (by etching the third features 50) such that the width W9 of middle regions 54 equals about 72 nm. This etch increases the width W10 of middle regions 124 of fourth spaces 120 to about 128 nm. After the etch, the width of ends 122 of fourth spaces 120 is increased by about 20 nm, from about 72 nm (W2) to about 92 nm (W11). Spacer sidewalls 70 are formed over the third features 50 at a thickness greater than or equal to one-half the width of the ends 122 of fourth spaces 120 such that spacer sidewalls 70 substantially contact each other in ends 122. Since ends 122 of fourth spaces 120 have a width of about 92 nm, the thickness of spacer sidewalls 70 is about 46 nm (from about 41 nm to about 51 nm), substantially filling ends 122 of fourth spaces 120. The spacer sidewalls 70 isolate seventh spaces 130, which have a width reduced by about twice the thickness of the spacer sidewalls 70. Upon removal of third features 50, as previously described, the spacer sidewalls 70, fifth spaces 140, and seventh spaces 130 form a mask used to pattern the underlying substrate 60, resulting in fourth features 62 on substrate 60 having a pitch of one-half of the first pitch X.

By way of non-limiting example, if the pitch to be achieved by pitch doubling is about 50 nm and F is about 35 nm, the width W3 of middle regions 54 of third features 50 and the width W4 of middle regions 124 of fourth spaces 120 may be about 50 nm, and the width W2 of ends 122 of fourth spaces 120 may be about 35 nm. As such, the first pitch X is 100 nm. The width W1 of ends 52 of third features 50 may be about 65 nm. Third features 50 may be trimmed by about 15 nm such that the widths of ends 122 and middle regions 124 of fourth spaces 120 increase to about 50 nm (W11) and about 65 nm (W10), respectively. Spacer sidewalls 70 having a thickness equal to about 25 nm (between about 20 nm and about 30 nm) may be deposited over the third features 50, isolating the seventh spaces 130. The pattern transferred to the substrate 60 using the spacer sidewalls 70, fifth spaces 140, and seventh spaces 130 as a mask may form features of about 25 nm in the substrate 60. The pitch may be about 50 nm.

Figure 4A:
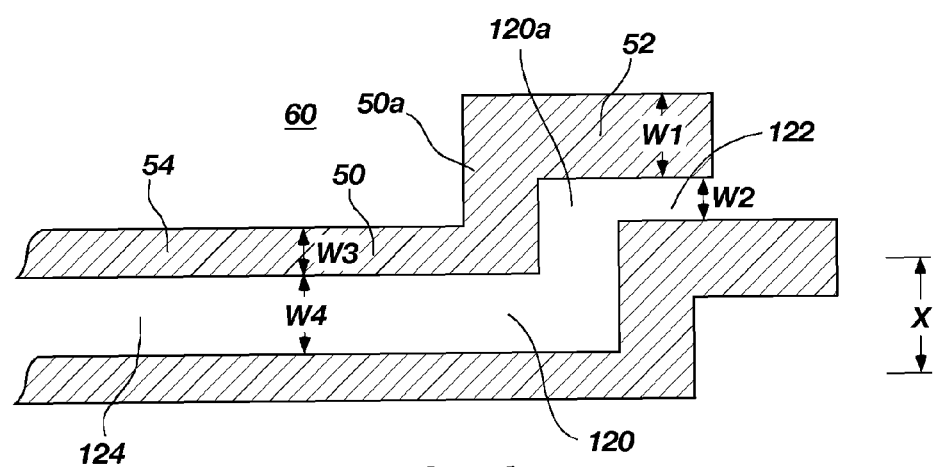
FIGS. 4A-4C are top-down views of a semiconductor device structure during various stages of processing according to an embodiment of the present invention.
Figure 4B:
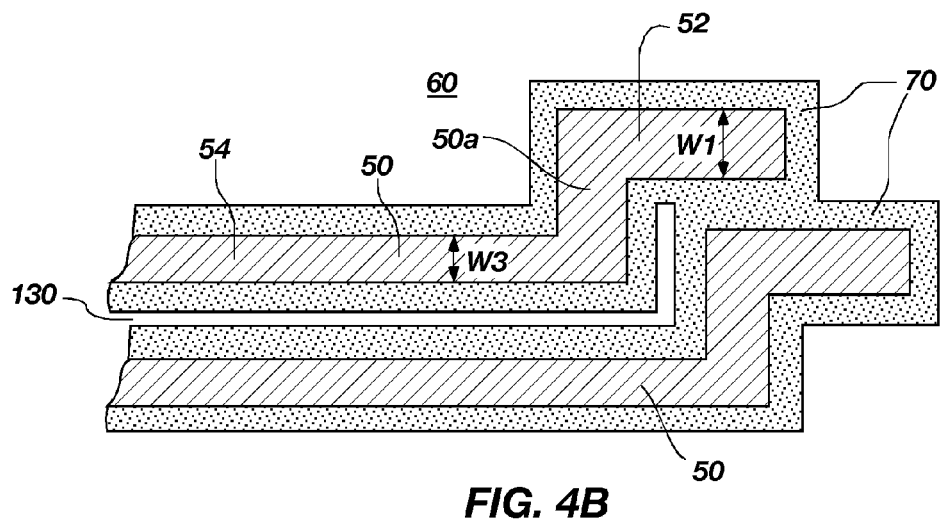
Figure 4C:
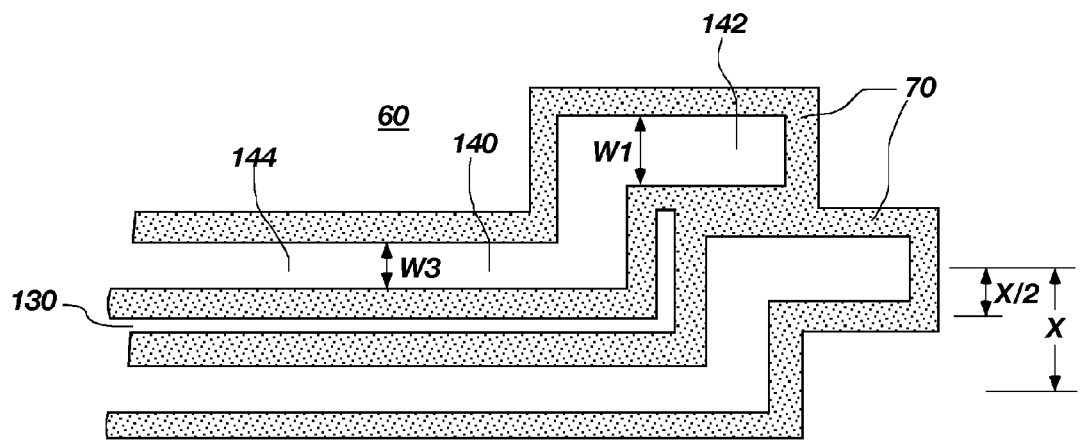

Another embodiment where a portion of third features 50 forms a so-called "L" shape is illustrated in FIGS. 4A-4C. In this embodiment, the trim process described above may be avoided by producing the middle regions 54 of the third features 50 having a width W3 substantially equal to F. The width W1 of ends 52 of third features 50 may be greater than F. The third features 50 may be formed by a lithography technique capable of printing the desired F. Fourth spaces 120 may be formed with ends 122 having a width W2 about equal to F. The width W4 of middle regions 124 of fourth spaces 120 may have a width greater than F and about equal to the width W1 of ends 52 of third features 50. FIG. 4B illustrates spacer sidewalls 70 surrounding each of third features 50. The spacer sidewalls 70 are formed by depositing the spacer material on the third features 50 and anisotropically etching the spacer material, as previously discussed. The thickness of spacer sidewalls 70 equals about one-half the width W2 of ends 122 of fourth spaces 120. Therefore, the adjacent spacer sidewalls 70 come into substantial contact in ends 122, isolating seventh spaces 130. As illustrated in FIG. 4C, the third features 50 are removed, forming fifth spaces 140. Fifth spaces 140 and seventh spaces 130 are isolated by spacer sidewalls 70. The spacer sidewalls 70, fifth spaces 140, and seventh spaces 130 are used as a mask to pattern the substrate 60, resulting in fourth features 62 on substrate 60 having a pitch of one-half of the first pitch X.

By way of non-limiting example, if the pitch to be achieved by pitch doubling is about 100 nm and F is about 72 nm (from about 69 nm to about 75 nm), the third features 50 may be formed by a lithography technique capable of achieving F. By forming the third features 50 at F, etching or trimming the third features 50 is eliminated, reducing capital costs and fabrication space. The width W3 of middle regions 54 of third features 50 is about 72 nm, as is the width W2 of ends 122 of fourth spaces 120. The first pitch X between third features 50 is about 200 nm. Spacer sidewalls 70 are formed over the third features 50 at a thickness greater than or equal to one-half the width W2 of the ends 122 of fourth spaces 120 such that spacer sidewalls 70 substantially contact each other in ends 122 of fourth spaces 120. Since ends 122 of fourth spaces 120 have a width of about 72 nm, spacer sidewalls 70 are deposited at a thickness of about 36 nm (between about 31 nm and about 41 nm), substantially filling ends 122 of fourth spaces 120 and isolating seventh spaces 130. Upon removal of third features 50, the spacer sidewalls 70, fifth spaces 140, and seventh spaces 130 form a pattern that is used as a mask to etch the substrate 60. The pattern formed in substrate 60 has a pitch of one-half of the original pitch X.

By way of non-limiting example, if the pitch to be achieved by pitch doubling is about 50 nm and F is about 35 nm, the width W3 of middle regions 54 of third features 50 may be about 35 nm, the width W4 of middle regions 124 of fourth spaces 120 may be about 65 nm, and the width W2 of ends 122 of fourth spaces 120 may be about 35 nm. The width W1 of ends 52 of third features 50 may be about 65 nm. As such, the first pitch X is 100 nm. Spacer sidewalls 70 having a thickness equal to about 17.5 nm may be deposited over the third features 50, isolating the seventh spaces 130. The pattern transferred to the substrate 60 using the spacer sidewalls 70 as a mask may form features of 25 nm in the substrate 60 having a pitch of 50 nm.

Figure 5A:
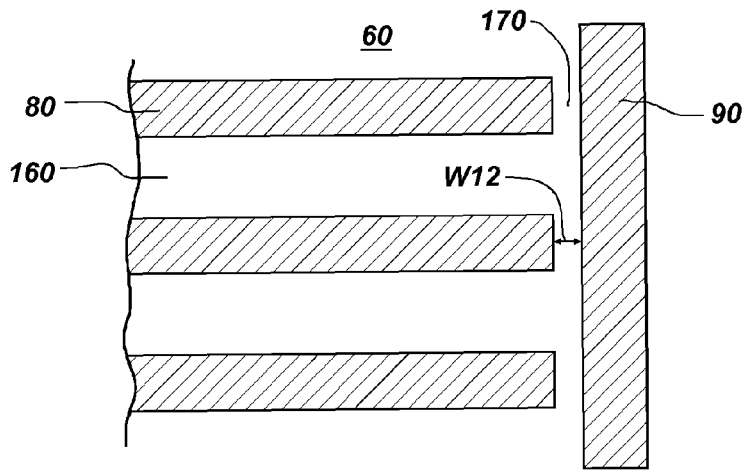
FIGS. 5A-5C are top-down views of a semiconductor device structure during various stages of processing according to an embodiment of the present invention.

Another method of isolating spaces between features created by the pitch reduction process without using a second masking level utilizes an additional feature, as illustrated in FIGS. 5A-5C and FIG. 6. As shown in FIG. 5A, an array of fifth features 80 is present on substrate 60, along with sixth feature 90. The fifth features 80 may be separated from each other by eighth spaces 160 and may be separated from the sixth feature 90 by ninth spaces 170. The sixth feature 90 may be located adjacent to ends of the fifth features 80. The fifth features 80 and sixth feature 90 may be positioned in proximity to one another such that spacer sidewalls 95 deposited on the fifth features 80 and sixth feature 90 come into substantial contact with one another in the ninth spaces 170. The spacer sidewalls 95 substantially fill ninth spaces 170, isolating eighth spaces 160. The materials and many of the process acts used to isolate the eighth spaces 160 may be as previously described.

The fifth features 80, eighth spaces 160, and sixth feature 90 may be formed on the substrate 60 by depositing a resist or other sacrificial material on the substrate 60. The fifth features 80 and sixth feature 90 may be formed from the same material, such as one of the materials previously described. The resist or sacrificial material may be patterned using an appropriate mask, forming the fifth features 80, eighth spaces 160, and sixth feature 90. The fifth features 80 may be printed on the substrate 60 at F or at a feature size greater than F. By way of non-limiting example, the fifth features 80 may have a feature size of 100 nm or a feature size of 75 nm. However, the feature size may be any size achievable by conventional lithographic techniques. In one embodiment, the sixth feature 90 may be substantially linear and may be oriented substantially perpendicular to the fifth features 80 and the eighth spaces 160, as illustrated in FIG. 5A. By way of non-limiting example, the sixth feature 90 may be a line. The substrate 60 may be one of the materials previously described.

Figure 5B:
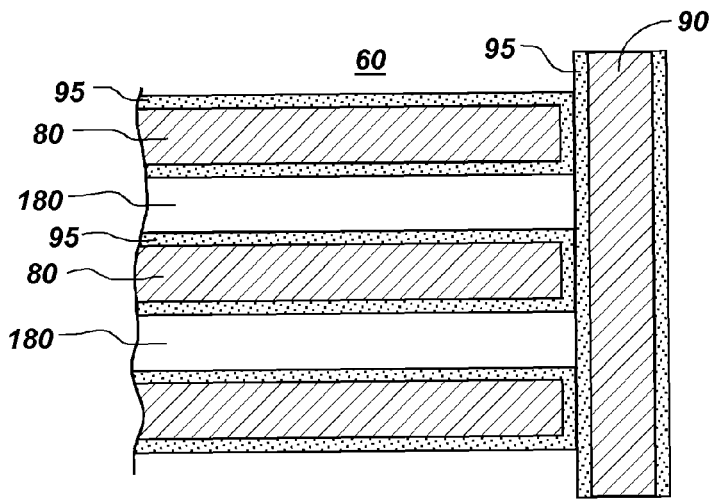

A spacer material may be deposited over the fifth features 80 and sixth feature 90 and anisotropically etched to form the spacer sidewalls 95, as illustrated in FIG. 5B. The spacer material may be one of the materials previously described and may be conformally deposited over the fifth features 80 and sixth feature 90. The spacer sidewalls 95 may reduce the width of the eighth spaces 160, producing tenth spaces 180. The width W12 of ninth spaces 170 may be configured so as to enable eighth spaces 160 to self-isolate by the deposition of the spacer material during the pitch doubling process. The spacer material may be deposited at a thickness sufficient to substantially fill ninth spaces 170. The thickness of the spacer material may also be sufficient to reduce the width of eighth spaces 160 to approximately the same width as fifth features 80. The thickness of the spacer sidewalls 95 may substantially correspond to the width of lines ultimately formed in substrate 60. The width of eighth spaces 160 is reduced by twice the thickness of the spacer sidewalls 95 so that the width of fifth features 80 and tenth spaces 180 may be substantially the same. The spacer sidewalls 95 may be deposited at a thickness greater than or equal to about one-half the width W12 of ninth spaces 170. Therefore, spacer sidewalls 95 come into substantial contact with one another in the ninth spaces 170, substantially filling ninth spaces 170 and self-isolating the eighth spaces 160 between fifth features 80.

Figure 5C:
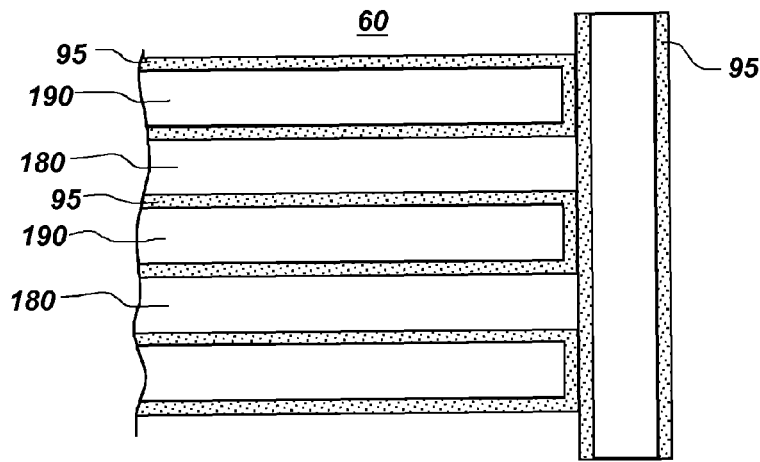

After eighth spaces 160 are isolated by spacer sidewalls 95, fifth features 80 may be removed, as illustrated in FIG. 5C. The fifth features 80 may be removed or etched as previously described. Removing fifth features 80 produces eleventh spaces 190 where fifth features 80 were previously located. The eleventh spaces 190 are surrounded by spacer sidewalls 95. Both tenth spaces 180 and eleventh spaces 190 are isolated by spacer sidewalls 95 since the spacer sidewalls 95 come into substantial contact with one another in ninth spaces 170 during the pitch doubling process. The tenth spaces 180, eleventh spaces 190, and spacer sidewalls 95 may be used as a mask to pattern substrate 60, forming features (not illustrated) and lines (not illustrated) in the substrate 60. The transfer of the pattern into the substrate 60 may be conducted as previously described. The width of the fifth features 80 may correspond to the width of the features to be formed in the substrate 60 and the width of the spacer sidewalls 95 may correspond to the width of the lines to be formed in the substrate 60.

Figure 6:
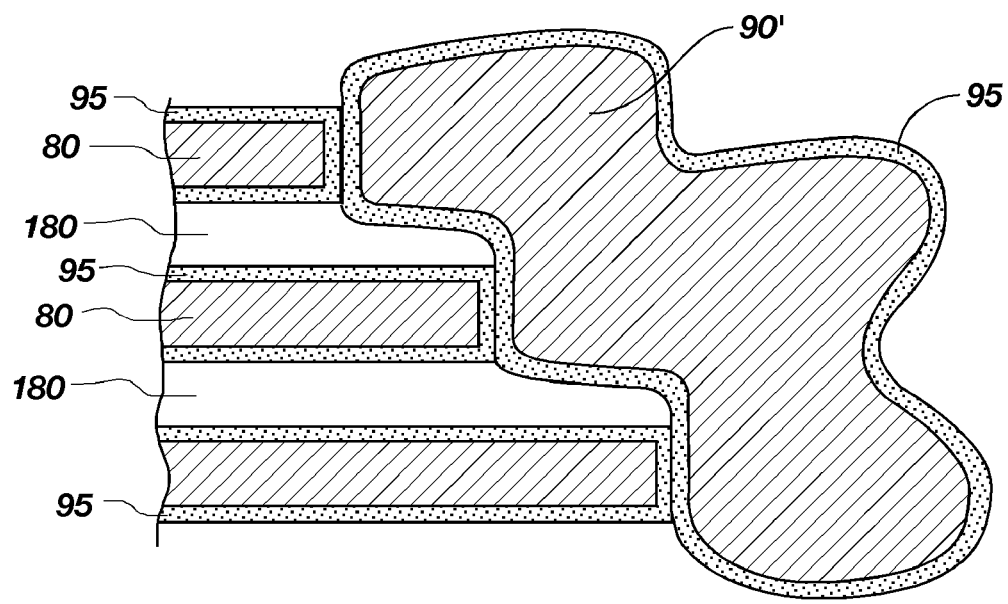
FIG. 6 is a top-down view of a semiconductor device structure during processing according to an embodiment of the present invention.

In another embodiment, the sixth feature 90' may have an irregular shape, as illustrated in FIG. 6. The sixth feature 90' may be located adjacent to ends of the fifth features 80 and may be separated from the fifth features 80 by ninth spaces 170 (not illustrated). The sixth feature 90' may be positioned in proximity to the fifth features 80 such that spacer sidewalls 95 on the fifth features 80 and on the sixth feature 90' come into substantial contact with one another in the ninth spaces 170. Apart from the shape of sixth feature 90', other process acts used to isolate the eighth spaces 160 may be as previously described in FIGS. 5A-5C. When the spacer sidewalls 95 are formed on the fifth features 80 and sixth feature 90', the spacer sidewalls 95 substantially fill the ninth spaces 170, producing and isolating tenth spaces 180. Fifth features 80 may be separated from each other by eighth spaces 160. The distance between fifth features 80 and eighth spaces 160 may be configured such that upon pitch doubling, tenth spaces 180 become isolated by a spacer material deposited on sixth feature 90'.

Patterned substrate 60 formed by any of the above-mentioned methods may be subjected to additional processing to produce the desired integrated circuit devices. Such processing is known in the art and, therefore, is not described in detail herein. For the sake of example only, patterned substrate 60 may be used in a damascene process. In one example of a damascene process, the patterned substrate 60 may include trenches in an oxide material. A conductive material may be deposited over the oxide material, filling the trenches. The surface of the oxide material may then be planarized, forming conductive lines in the oxide material. Damascene processes are known in the art, and, therefore, are not discussed in detail herein.

The above-mentioned method may be used to form semiconductor device structures that have a dense pattern of array features. The patterned substrate 60 may be utilized in IC devices, such as in dynamic random access memories (DRAMs), static random access memories (SRAMs), ferroelectric (FE) memories, NAND and NOR Flash memories, microprocessors, such as with field-effect transistors (FETs), CMOS imagers, and flat-panel displays. By way of non-limiting example, the patterned substrate 60 may be used in forming a Flash device.

Any of the above-mentioned acts may be combined with other acts depending upon the materials used and the processes used in forming and removing the materials. Additionally, any of the above-mentioned acts may utilize multiple processes to accomplish the single act. After any act, further processing, not described above, may occur, such as cleaning, ion implantation, diffusion doping, deposition of additional materials, wet or dry etching, and chemical-mechanical polishing, among others.

The above-described embodiments may be used to isolate the fourth spaces 120 between third features 50 during a pitch doubling process. It should be understood that there are no limitations on the pitch doubling processes usable with the embodiments of the present invention. Accordingly, it should also be understood that third features 50 may be patterned, trimmed, and/or further processed in any manner necessary for a given pitch doubling process as long as the thickness of spacer sidewalls 70 deposited in ends 122 of fourth spaces 120 is equal to or greater than one-half the width W2 of ends 122.

In addition, there is no lower limit on the feature size of the third features 50 that may be used with embodiments of the present invention. For example, regardless of the lithography process used to produce the third features 50, embodiments of the present invention may be used to isolate fourth spaces 120 between the third features 50.

While the invention is susceptible to various modifications as well as alternative forms and implementations, specific embodiments have been shown by way of example in the drawings and have been described in detail herein. However, it should be understood that the invention is not limited to the particular embodiments disclosed. Rather, the invention encompasses all modifications, equivalents, and alternatives falling within the spirit and scope of the invention as defined by the following appended claims.

What is claimed is:

1. A method of semiconductor fabrication, comprising:
   forming a plurality of resist features on a substrate, each resist feature of the plurality of resist features comprising an "L" shaped portion adjacent a middle portion of each resist feature of the plurality of resist features, the "L" shaped portion comprising a first portion at least substantially perpendicular to the middle portion of each resist feature of the plurality of resist features and a second portion at least substantially parallel to the middle portion of each resist feature of the plurality of resist features; and
   forming spacers on each resist feature of the plurality of resist features with a portion of the spacers on the second portions of the "L" shaped portions of adjacent resist features of the plurality of resist features in substantial contact with one another.

2. The method of claim 1, wherein forming a plurality of resist features on a substrate, each resist feature of the plurality of resist features comprising an "L" shaped portion adjacent a middle portion of each resist feature of the plurality of resist features comprises forming the "L" shaped portions of the adjacent resist features of the plurality of resist features staggered with respect to one another and separated by a distance.

3. The method of claim 1, wherein forming a plurality of resist features on a substrate, each resist feature of the plurality of resist features comprising an "L" shaped portion adjacent a middle portion of each resist feature of the plurality of resist features comprises forming the plurality of resist features having a pitch between the second portions of the "L" shaped portions of adjacent resist features of the plurality of resist features less than or about equal to one-half the pitch between the middle portions of adjacent resist features of the plurality of resist features.

4. The method of claim 1, wherein forming a plurality of resist features on a substrate comprises separating each of the plurality of resist features from at least one adjacent resist feature by a first space, wherein a width of the first space between the second portions of the "L" shaped portions of adjacent resist features is less than a width of a middle region of the first space.

5. The method of claim 1, wherein forming a plurality of resist features on a substrate comprises forming each of the plurality of resist features at a minimum feature size.

6. The method of claim 1, wherein forming spacers on each resist feature of the plurality of resist features comprises depositing the spacers at a thickness greater than or equal to about one-half a distance between adjacent second portions of the "L" shaped portions of the plurality of resist features.

7. The method of claim 1, wherein forming a plurality of resist features on a substrate comprises forming each of the plurality of resist features at a feature size greater than a minimum feature size.

8. The method of claim 7, further comprising etching each of the plurality of resist features to a minimum feature size.

9. The method of claim 1, further comprising removing the plurality of resist features to form a pattern comprising the spacers.

10. The method of claim 9, further comprising transferring the pattern comprising the spacers to the substrate.

11. A semiconductor device structure, comprising:
a plurality of resist features on a substrate, wherein ends of the plurality of resist features comprise an "L" shaped portion, the "L" shaped portion comprising a first portion at least substantially perpendicular to a middle portion of each resist feature of the plurality of resist features and a second portion at least substantially parallel to the middle portion of each resist feature of the plurality of resist features; and spacers surrounding each of the plurality of resist features, wherein the spacers are in substantial contact with one another between the second portions of the "L" shaped portions of adjacent resist features of the plurality of resist features.

12. The semiconductor device structure of claim 11, wherein each of the plurality of resist features has a minimum feature size.

13. The semiconductor device structure of claim 11, wherein each of the plurality of resist features has a feature size greater than a minimum feature size.

14. The semiconductor device structure of claim 11, wherein adjacent spacers isolate a space between adjacent resist features of the plurality of resist features.

15. A semiconductor device structure, comprising:
a plurality of features on a substrate, each feature of the plurality of features comprising:
a middle portion; and
an end portion comprising at least one first end portion adjacent the middle portion, wherein the at least one first end portion is at least substantially perpendicular to the middle portion and at least one second end portion adjacent the at least one first end portion, wherein the at least one second end portion is at least substantially parallel to the middle portion;
spaces between the plurality of features, wherein spaces between the at least one second end portions of adjacent features of the plurality of features are narrower than spaces between the middle portions of adjacent features of the plurality of features; and
spacers surrounding each of the plurality of features, the spacers in substantial contact with one another in the spaces between the at least one second end portions of adjacent features of the plurality of features.

16. The semiconductor device of claim 15, wherein the at least one first end portions of adjacent features of the plurality of features are staggered.

17. The semiconductor device of claim 15, wherein the middle portion, the at least one first end portion, and the at least one second end portion of each feature of the plurality of features form a "Z" like shape.

18. The semiconductor device of claim 15, wherein spaces between the at least one first end portions of adjacent features of the plurality of features are wider than spaces between the middle portions of adjacent features of the plurality of features.

* * * * *